United States Patent [19]

McColgin et al.

[11] Patent Number: 4,931,351

[45] Date of Patent: Jun. 5, 1990

[54] BILAYER LITHOGRAPHIC PROCESS

[75] Inventors: William C. McColgin, Pittsford; Thomas B. Brust, Spencerport; Robert C. Daly, Rochester; Joseph Jech, Jr., Rochester; Robert D. Lindholm, Rochester, all of N.Y.

[73] Assignee: Eastman Kodak Company, Rochester, N.Y.

[21] Appl. No.: 378,471

[22] Filed: Jul. 13, 1989

Related U.S. Application Data

[63] Continuation of Ser. No. 2,077, Jan. 12, 1987, abandoned.

[51] Int. Cl.$^5$ .......................... G03C 5/00; G03C 5/40
[52] U.S. Cl. ..................................... 430/323; 430/313; 430/317; 430/326; 430/328; 156/628; 156/643
[58] Field of Search ............... 430/312, 313, 314, 315, 430/317, 323, 326, 328; 156/643, 628

[56] References Cited

U.S. PATENT DOCUMENTS

| | | | |
|---|---|---|---|
| 4,521,274 | 6/1985 | Reichmanis et al. | 156/643 |
| 4,613,398 | 9/1986 | Chiong et al. | 156/628 |
| 4,737,425 | 4/1988 | Lin et al. | 430/11 |
| 4,782,008 | 11/1988 | Babich et al. | 430/313 |

FOREIGN PATENT DOCUMENTS 0136130 4/1985 European Pat. Off. .
2154330 9/1985 United Kingdom .

OTHER PUBLICATIONS

Follett et al, "Polarity Reversal of PMMA by Treatment with Chlorosilanes", Electrochemical Sec., vol. 82-2, Extended Abstracts, Oct. 1982.

Primary Examiner—Jose Dees
Attorney, Agent, or Firm—William J. Davis

[57] ABSTRACT

A method for producing high resolution patterned resist images having excellent etch resistance and superior thermal and dimensional stability comprises the steps of:
(a) forming a planarizing layer resistant to silicon uptake on a substrate;
(b) providing a positive-working photoresist composition containing —OH or —NH— groups over the planarizing layer,
(c) imagewise exposing the resist to activating radiation,
(d) developing the exposed resist,
(e) contacting the developed resist with a vapor comprising a silicon-containing compound to effect silylation thereof and thereby impart etch resistance, the silicon-containing compound having the structural formula:

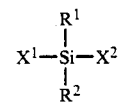

wherein:
$X^1$ and $X^2$ are individually chloro or

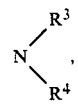

wherein
$R^3$ and $R^4$ are individually H or alkyl; and
$R^1$ and $R^2$ are individually H or alkyl; and
(f) contacting the planarizing layer with an oxygen-containing plasma so as to preferentially remove portions thereof.

7 Claims, No Drawings

BILAYER LITHOGRAPHIC PROCESS

This is a continuation of application Ser. No. 002,077, filed Jan. 12, 1987 now abandoned.

FIELD OF THE INVENTION

This invention relates to a method of forming etch-resistant polymeric resist images for use in the creation of micron and submicron dimension patterns and fine lines. The method is particularly useful in the fabrication of electronic devices.

BACKGROUND OF THE INVENTION

The need for higher resolution lithography in VLSI device processing has led to the development of various resist processes for fabricating finer and more densely-packed features on silicon wafers. One of these is the trilevel process which improves resolution but at a considerable cost in process complexity. In the trilevel process a thick organic planarizing layer is coated to level out the device topography. Next, a thin glass film is coated thereon. A thin layer of photoresist, coated over the glass, is used to pattern the glass. The glass layer then acts as a mask for oxygen plasma etching of the planarizing layer. Finally, the pattern is transferred into the silicon device.

Approaches to simplifying the trilevel process are being investigated. In one approach, a single thick layer of a photosensitive polymer is used. The polymer is designed to take up silicon from a vapor-treatment process in an imagewise fashion after the polymer has been exposed. The silylated portions at the top of the polymer layer act as the etch mask for the portions remaining below. Development is entirely a dry process. Such approaches incorporate some of the advantages of the trilayer process, but tend to be sensitive to flare light in the patterning exposure tool. Flare light can cause a silicon-containing scum which impedes etching.

Another approach involves replacing silicon in a glass layer with silicon in the resist itself for use with a planarizing layer in a bilayer process. For example, both positive- and negative-working presilylated resist materials, wherein silicon is formulated as part of the resist composition, are known. The silicon in the resist can form an $SiO_2$ etch mask upon exposure to an oxygen plasma. However, the amount of silicon required in presilylated resist formulations to achieve good etch resistance (up to approximately 15% by weight) lowers the glass transition temperature of the resist and renders the resist more hydrophobic. This results in poor developability in aqueous developers. For positive-working materials, thermal and dimensional instability during subsequent processing (pattern-transfer and etching steps) can result.

European Patent Application No. 0 136 130 describes a method of making articles using a resist formed by sorption of an inorganic-containing gas into an organic material. The resist is developed by exposure to a plasma that forms a protective compound. Example III therein describes the use of $SiCl_4$, $(CH_3)_2SiCl_2$ and $SnCl_4$ in a single layer system comprising a negative-working resist containing an azide sensitizer.

U.K. Patent Application GB 2154330 A discloses a method of fabricating semiconductor devices wherein silicon is introduced into novolac resin by exposure to an atmosphere of tetrachlorosilane or tetramethylsilane.

There is a growing need for a lithographic method, capable of producing high resolution submicron patterned resist images having excellent etch resistance and thermal and dimensional stability, which is compatible with existing resist materials and processing facilities and affords convenient device processing.

SUMMARY OF THE INVENTION

In accordance with the present invention, there is provided a method for producing high resolution patterned resist images which have excellent etch resistance and superior thermal and dimensional stability. The method comprises the steps of:

(a) forming a planarizing layer resistant to silicon uptake on a substrate, (b) providing a positive-working photoresist composition containing —OH or —NH— groups over the planarizing layer, (c) imagewise exposing the resist to activating radiation, (d) developing the exposed resist, (e) contacting the developed resist with a vapor comprising a silicon-containing compound to effect silylation thereof and thereby impart etch resistance, the silicon-containing compound having the structural formula:

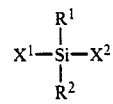

wherein:

$X^1$ and $X^2$ are individually chloro or

wherein $R^3$ and $R^4$ are individually H or alkyl; and $R^1$ and $R^2$ are individually H or alkyl; and (f) contacting the planarizing layer with an oxygen-containing plasma so as to preferentially remove portions thereof.

The method is compatible with existing resist materials and processing facilities and affords device processing under convenient conditions. Other advantageous features will become apparent upon reference to the following description of the preferred embodiments.

DESCRIPTION OF THE PREFERRED EMBODIMENTS

The invention is hereafter described particularly with regard to embodiments featuring certain preferred silylating agents and photoresist compositions and in a preferred usage, i.e. in a bilayer resist system. However, the silylating agents are also useful in single layer resists and with a wide variety of photoresist compositions and processing formats.

Positive-working photoresist compositions which can be used in the method of the present invention include materials containing sites capable of reacting with the silylating agent. These sites preferably comprise —OH or —NH— groups and are present in functional groups such as hydroxyl, amine, carboxyl and imide. It is believed that the active hydrogens of the —OH or —NH— groups are replaced by silicon during silylation. Particularly useful materials include novolac resins, resoles, polyvinylphenols and poly(hydroxyethyl methacrylate). Such polymers can be used alone or in combination with photoactive compounds to make up the photoresist composition. Preferred resists comprise a novolac resin and include KMPR 809, available from Eastman Kodak Co., and HPR 204 available from Hunt Chemical Co. The photoresist composition is responsive to activating radiation of any kind to produce an image after development of the resist. Preferred are those that respond to UV or visible radiation and those that respond to electron beams. The thickness of the resist layer preferably is less than about 3 μm.

The resist composition preferably has a glass transition temperature of less than about 75° C. It is believed that the uptake and/or diffusion of the silylating agent is facilitated by lower glass transition temperatures and by the presence of —COOH groups.

In accordance with the invention, a planarizing layer resistant to silicon uptake is formed on a substrate. As used herein "substrate" includes semiconductor supports, including, if desired, various levels of, for example, metallization, doped semiconductor material and/or insulators. For the manufacture of integrated circuit devices, silicon or silicon dioxide wafers, as well as silicon nitride and chromium-coated glass plate substrates are particularly useful. Depending upon the support selected, adhesion aids are optionally applied first as a sub-coating.

The planarizing layer is selected to be resistant to silicon uptake. Conventional planarizing layers such as thermally crosslinked novolacs, poly(methyl methacrylate), poly(methyl isopropenyl ketone), polyimides and polydimethylglutarimide are useful herein. The thickness of the planarizing layer preferably is less than 10 μm. The planarizing layer must be removable with an oxygen plasma but not appreciably dissolve in the solvent utilized to form the imaging layer.

In addition to the planarizing layer, or admixed therewith, there can be present one or more dye-containing antireflection layers, contrast enhancing layers or etch stop layers.

Conventional methods can be used to apply the planarizing layer to the substrate and the resist to the planarizing layer. The preferred method is as a coating using an appropriate solvent. Useful coating techniques include spin-coating, spray coating, and roll coating. The solvent used to prepare the compositions for coating can be selected from any conventional coating solvent. Useful solvents include alcohols, esters, ethers, ketones, and, particularly, ethanol, 2-ethoxyethyl acetate, n-butyl acetate, 4-butyrolactone, chlorobenzene and mixtures thereof.

The equipment used to imagewise expose the resist is conventional. The method is particularly useful in conjunction with electron beams or exposure sources emitting at from 250 to 450 nm. The exposure times vary depending on the desired results and equipment and materials used, preferred times being in the range of about 1 m sec. to about 90 sec.

Development of the resist is accomplished by contacting the exposed resist with a suitable developer. Suitable developers include tetramethylammonium hydroxide, tetraethylammonium hydroxide, methyltriethanol ammonium hydroxide, sodium hydroxide, ammonium hydroxide, potassium hydroxide, sodium carbonate, sodium silicate, sodium phosphate, hexane, cyclohexane, methylisobutyl ketone, mixtures thereof, and the like. The developer can contain lower alcohols, ketones, or amines such as alkylamines, cycloalkylamines and alkanolamines. Etch impeding scum resulting from flare light is minimized because the resist is developed prior to silylation. After development, the imaged bilayer preferably is rinsed in deionized water.

As noted, an advantageous feature of the method of this invention is that it is compatible with existing resist processing facilities and affords convenient device processing. Inspection, after exposure and development of the resist is easily performed. Lines and spaces as small as 0.6 μm and smaller can be inspected for cleanout, for example, in an optical microscope. After inspection, the resist layer can be stripped, if desired, without affecting the planarizing layer. Furthermore, the pattern can be conveniently inspected after silylation. The critical lithographic properties of the silylated etch mask formed, such as critical line width and alignment are readily measurable, whereas in the case of imagewise silylation of a single layer system, they are not.

The developed resist optionally is exposed to a UV light source to enhance silicon uptake prior to contacting the resist with the silicon-containing compound. The wafer can be flood exposed conveniently for a fraction of a second up to several minutes to a UV light from a suitable exposure source as illustrated in the following examples. In some embodiments of the invention, an exposure time from 5 to 40 seconds is preferred.

After development, and optionally, exposure to a UV light source, the resist is contacted with a vapor comprising a silicon containing compound to effect silylation of the resist and thereby render it etch resistant. Silylation can be conveniently accomplished by placing the wafer on a temperature controlled platen in a vacuum oven. The system can be evacuated by conventional means. The silicon-containing compound in vapor form can then be introduced, optionally, if desired, with an inert carrier gas such as $N_2$. After silylating for the desired time, the system can be flushed, and the wafer removed. As noted, a particularly advantageous feature of the present invention is that convenient device processing is afforded. For example, silylation sufficient to yield good etch resistance can be accomplished in less than 2 hours, and as indicated by the examples which follow, in most instances in 10 minutes or less.

The silicon-containing compound useful herein preferably has the formula set forth in the summary above, wherein $X^1$ and $X^2$ are individually chloro or

wherein $R^3$ and $R^4$ are individually H or alkyl, preferably containing from 1 to 3 carbon atoms, such as methyl, ethyl and propyl; and $R^1$ and $R^2$ are individually H or alkyl, preferably containing from 1 to 3 carbon atoms, such as methyl, ethyl and propyl. As noted, these silicon-containing compounds (referred to herein also as silylating agents) produce high resolution patterned resist images which have excellent etch resistance and superior thermal and dimensional stability.

Preferred silylating agents useful in the method of this invention include:

(a) dichlorodimethylsilane,
(b) dichloromethylsilane,
(c) bis(dimethylamino)dimethylsilane,
(d) bis(dimethylamino)methylsilane,
(e) dimethylamino chlorodimethylsilane, and
(f) dimethylamino chloromethylsilane.

Preferred silylating agents include those having the structural formula above wherein at least one of $R^1$, $R^2$, $R^3$ and $R^4$ is H. These compounds provide superior silylation at lower temperatures and pressures than other silanes. Although the mechanism is not well understood, it is believed that the reactivity and/or absorptivity of these compounds is facilitated by the presence of the hydrogen atom. High preferred examples of such silylating agents include (b), (d) and (f) noted above.

The imaged bilayer containing the silylated resist is contacted with an oxygen plasma so as to preferentially remove portions of the planarizing layer by methods which are conventional in the art. Pattern transfer can be accomplished by an oxygen plasma etch. In a preferred embodiment, pattern transfer is by an oxygen plasma reactive ion etch ($O_2$—RIE). We have found that an $O_2$—RIE provides side walls which are straighter and more uniform than with a conventional wet or oxygen plasma development. Reactive ion etching and oxygen plasma etching are described by S. J. Jonash in "Advances in Dry Etching Processes—A Review," *Solid State Technology*, January 1985, pages 150–158 and the references cited therein.

EXAMPLES

The following examples further illustrate the invention.

EXAMPLE 1

Silylation with Dichloromethylsilane

A silicon wafer was coated with Kodak KMPR-820 resist, prebaked, and then hardbaked at 275° C. for 90 sec. on a track hotplate to produce a planarizing layer film about 1.0 μm thick. KMPR-809 photoresist (20% solids) was then coated over the planarizing layer and prebaked at 90° C. for 30 min. in a convection oven. The resist layer was about 4000 Å thick. The wafer was then repeatedly exposed to the image of a resolution target using a Censor SRA-200 wafer stepper (405 nm, NA=0.28) in a range of exposures from 55 mJ/cm$^2$ to 145 mJ/cm$^2$. The wafer was then developed for 40 sec. at room temperature in Kodak ZX-934 developer diluted to 35% and rinsed in deionized water. Lines and spaces as small as 0.6 μm were resolved. The wafer was then silylated in a modified vacuum oven as follows: The wafer was placed in the oven on a platen maintained at 75° C. The oven was pumped down for one minute to a pressure of 330 millitorr. Dichloromethylsilane (DCMS) vapor was then admitted into the oven and the wafer was silylated for 25 min. at a DCMS pressure of 110 torr. The oven was pumped out and back-filled with nitrogen twice, and the wafer was removed. The wafer was then etched for three minutes in an $O_2$—RIE etch of a MRC 51 plasma reactor. The conditions were 50 sccm of $O_2$ flow, 150 millitorr of pressure, and 200 volts DC bias. The etch rate, determined by film thickness measurements, was about 175 Å/min. The unsilylated KMPR-809 etch rate is about 1000–1100 Å/min. The etch rate for the planarizing layer was also about 1000–1100 Å/min. and was essentially unchanged by the treatment. The wafer was etched for an additional 7 min. to complete etching of the planarizing layer. The silylated resist did not flow, evidencing superior dimensional stability.

Example 1 was repeated except that the silylating agent was hexamethyldisilazane and the silylating conditions were milder (10 min. at 80 torr.). The resist flowed significantly, evidencing dimensional instability.

EXAMPLE 2

Example 1 was repeated except that the silylation conditions were increased to 93° C. for 135 min. at 150 torr. Again the silylated 809 resist showed no evidence of flow either after silylation or after the 3 min. etch. The etch rate was reduced to about 110 Å/min.

EXAMPLE 3

Demonstration of Temperature Stability

Example 1 was repeated except that the silylation was at 93° C. for 10 min. at 150 torr. The silylated resist showed no evidence of flow after silylation or after the etch. The etch rate of the wafer was about 117 Å/min.

A wafer prepared as described in the preceding paragraph was placed on a coating-track hot plate for two minutes at a time, for an increasing series of temperatures. After each bake, the patterned wafer was observed with an optical microscope. The DCMS-treated wafer showed no evidence of flow at hot plate temperatures as high as 160° C.

COMPARATIVE EXAMPLES

A wafer prepared as described in Example 1 except not treated with a silylating agent flowed at 110° C.

The silylation of Example 3 was repeated except that the silylating agent was chlorotrimethylsilane. The etch rate of the silylated resist was over 830 Å/min., evidencing poor etch resistance. Furthermore, the resist flowed significantly, evidencing dimensional instability.

EXAMPLES 4–13

Effect of Flood Exposure

Example 1 was repeated except that the silylating agents were bis(dimethylamino)dimethylsilane and bis(dimethylamino)methylsilane. The silylating conditions were 90° C. for 15 min. at 100 torr. The etch rates of the silylated resist were 508 and 197 Å/min., respectively. The resists did not flow. When the wafers were flood exposed for 5 seconds to UV light from a Hybrid Technology Group (HTG) exposure source with the near UV mirrors installed (an irradiance of 59 mw/cm$^2$ was measured with an HTG Model 100 power meter using the 405 nm probe), the etch rates dropped to 326 and 76 Å/min. About the same etch rates resulted from a 40 second exposure under the same conditions.

Example 3 was repeated except that the resists were flood exposed in the manner described above for 5 and 40 seconds. The etch rates were 91 and 41 Å/min.

When the resist of Example 1 was similarly flood exposed, the etch rate was not appreciably affected.

EXAMPLES 14–16

Silylation with Dichlorodimethylsilane

Example 1 was repeated except that the silylating agent was dichlorodimethylsilane and the silylation was at 100° C., 190 torr. for 90 min. The silylated resist (Example 14) did not flow. The etch rate was 276 Å/min.

Example 14 was repeated except that the wafers containing the developed resist were flood exposed to UV light for 5 and 40 seconds, as described above. The etch rates were 119 and 126 Å/min., respectively. The silylated resists did not flow.

EXAMPLES 17–19

Effect of Photoresist

Example 3 was repeated except that HPR 204 was used in place of KMPR 809. The silylated resist showed no evidence of flow after silylation or after the etch. The silylated resist (Example 17) had an etch rate of about 69 Å/min.

Example 17 was repeated except that wafers containing the developed resist were flood-exposed to a UV light source for 5 and 40 seconds. The etch rates were 18 and 15 Å/min., respectively. The resists did not flow.

EXAMPLE 20

Effect of Planarizing Layer

A planarizing layer of poly(methyl methacrylate) subjected to the silylation conditions of Example 3 had an etch rate of 1601 Å/min. Under the same conditions, the etch rate of the KMPR-820 was 1052 Å/min. As is evident, excellent etch selectivities can be obtained.

The invention has been described in detail with particular reference to preferred embodiments thereof, but it will be understood that variations and modifications can be effected within the spirit and scope of the invention.

What is claimed is:

1. A method for producing a patterned high resolution, thermally and dimensionally stable resist image on a substrate comprising the steps of:
   (a) forming a planarizing layer resistant to silicon uptake on a substrate,
   (b) providing a positive-working photoresist composition containing —OH or —NH— groups over said planarizing layer,
   (c) imagewise exposing said resist to activating radiation,
   (d) developing said exposed resist,
   (e) contacting said developed resist with a vapor comprising a silicon-containing compound for a time less than 2 hours to effect silylation thereof and thereby impart etch resistance, said silicon-containing compound having the structural formula:

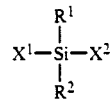

wherein:
$X^1$ and $X^2$ are individually chloro or

wherein $R^3$ and $R^4$ are individually H or alkyl containing from 1 to 3 carbon atoms; and $R^1$ and $R^2$ are individually H or alkyl containing from 1 to 3 carbon atoms; and wherein at least one of $R^1$, $R^2$, $R^3$ and $R^4$ is H; and
   (f) contacting said planarizing layer with an oxygen-containing plasma so as to preferentially remove portions thereof.

2. The method of claim 1 wherein said developed resist is exposed to a UV light source prior to contacting said resist with said silicon-containing compound.

3. The method of claim 1 wherein said silicon-containing compound is selected from the group consisting of dichloromethylsilane, bis(dimethylamino)methylsilane, and dimethylamino chloromethylsilane.

4. The method of claim 1 wherein said resist has a glass transition temperature of less than about 75° C.

5. The method of claim 1 wherein said resist comprises a novolac resin.

6. The method of claim 1 wherein portions of said planarizing layer are preferentially removed by an oxygen reactive ion etch.

7. A method for producing a patterned high resolution, thermally and dimensionally stable resist image on a substrate comprising the steps of:
   (a) forming a planarizing layer resistant to silicon uptake on a substrate,
   (b) providing a positive-working photoresist composition containing —OH or —NH— groups over said planarizing layer,
   (c) imagewise exposing said resist to activating radiation,
   (d) developing said exposed resist,
   (e) contacting said developed resist with a vapor comprising dimethylamino chlorodimethylsilane for a time less than 2 hours to effect silylation thereof and thereby impart etch resistance, and
   (f) contacting said planarizing layer with an oxygen-containing plasma so as to preferentially remove portions thereof.

* * * * *